(12) United States Patent
Jeong et al.

(10) Patent No.: US 8,557,896 B2
(45) Date of Patent: Oct. 15, 2013

(54) ADHESIVE COMPOSITION FOR A SEMICONDUCTOR DEVICE, ADHESIVE FILM, AND DICING DIE-BONDING FILM

(75) Inventors: Chul Jeong, Uiwang-si (KR); Ki Tae Song, Uiwang-si (KR); Han Nim Choi, Uiwang-si (KR); Su Mi Im, Uiwang-si (KR); Ah Ram Pyun, Uiwang-si (KR); Sang Jin Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 297 days.

(21) Appl. No.: 12/979,008

(22) Filed: Dec. 27, 2010

(65) Prior Publication Data
US 2011/0160339 A1    Jun. 30, 2011

(30) Foreign Application Priority Data
Dec. 28, 2009   (KR) .................. 10-2009-0132244

(51) Int. Cl.
*C08K 9/06* (2006.01)

(52) U.S. Cl.
USPC ........... 523/212; 523/213; 523/223; 524/261; 524/262

(58) Field of Classification Search
USPC ................... 523/223, 212, 213; 524/261, 262
See application file for complete search history.

(56) References Cited

U.S. PATENT DOCUMENTS

2002/0155286 A1* 10/2002 Kobayashi et al. ..... 428/355 EP

* cited by examiner

Primary Examiner — Edward Cain
(74) Attorney, Agent, or Firm — Lee & Morse, P.C.

(57) ABSTRACT

An adhesive composition for semiconductor devices, an adhesive film, and a dicing die bonding film, the adhesive composition including an elastomer resin, an epoxy resin, a curable phenolic resin, a curing accelerator, a silane coupling agent, and a filler, wherein the silane coupling agent includes an epoxy group-containing silane coupling agent and a transition metal scavenging functional group-containing silane coupling agent.

19 Claims, No Drawings

ADHESIVE COMPOSITION FOR A SEMICONDUCTOR DEVICE, ADHESIVE FILM, AND DICING DIE-BONDING FILM

BACKGROUND

1. Field

Embodiments relate to an adhesive compositions for a semiconductor device and an adhesive film.

2. Description of the Related Art

Silver (Ag) pastes may be used to bond semiconductor devices together or to bond a semiconductor device to a supporting member. As semiconductor devices have become smaller with a larger capacity, supporting members for the semiconductor devices may also be smaller and more precise. When silver paste is used to bond semiconductor devices or to bond a semiconductor device to a supporting member, the silver paste may leak from a bonding surface between semiconductor devices or may cause inclination of the semiconductor device. As a result, the Ag paste may cause a malfunction, bubble generation, and difficulty in thickness control during wire bonding. Thus, adhesive films may be used as an alternative to the silver paste.

SUMMARY

Embodiments are directed to an adhesive composition for a semiconductor device and an adhesive film.

The embodiments may be realized by providing an adhesive composition for semiconductor devices, the adhesive composition including an elastomer resin, an epoxy resin, a curable phenolic resin, a curing accelerator, a silane coupling agent, and a filler, wherein the silane coupling agent includes an epoxy group-containing silane coupling agent and a transition metal scavenging functional group-containing silane coupling agent.

The transition metal scavenging functional group may include at least one of —CN, —COOH, —NCO, —SH, and —NH$_2$.

The epoxy group-containing silane coupling agent may be present in an amount of about 15 wt % to less than 100 wt %, based on a total weight of the silane coupling agent.

The silane coupling agent may include about 30 to about 60 wt % of the epoxy group-containing silane coupling agent and about 40 to about 70 wt % of the transition metal scavenging functional group-containing silane coupling agent.

The adhesive composition may include a transition metal scavenging component, the transition metal scavenging component including the transition metal scavenging functional group-containing silane coupling agent, and the adhesive composition may include a greater amount of the transition metal scavenging component than an amount of the epoxy group-containing silane coupling agent.

The adhesive composition may include about 2 to about 50 wt % of the elastomer resin, about 4 to about 50 wt % of the epoxy resin, about 3 to about 50 wt % of the curable phenolic resin, about 0.01 to about 10 wt % of the curing accelerator, about 0.1 to about 10 wt % of the silane coupling agent, and about 0.1 to about 50 wt % of the filler.

The adhesive composition may further include a transition metal scavenger.

The transition metal scavenger may include at least one of an organic compound including at least one of cyanides and triazole derivatives; and an inorganic ion exchanger including at least one of a hydrotalcite-based ion scavenger, a bismuth oxide-based ion scavenger, an antimony oxide-based ion scavenger, a titanium oxide-based ion scavenger, and a zirconium phosphide-based ion scavenger.

The transition metal scavenger and the transition metal scavenging functional group-containing silane coupling agent may be present in an amount of about 50 wt % to less than about 100 wt %, based on a total weight of the silane coupling agent and the transition metal scavenger.

The adhesive composition may further include an organic solvent.

The elastomer resin may include an acrylic polymer including at least one of a hydroxyl group, a carboxyl group, and an epoxy group.

The epoxy resin may include about 50 wt % or more of a polyfunctional epoxy resin.

The curable phenolic resin may include about 50 wt % or more of a phenol novolac.

The curing accelerator may include at least one of a phosphine-based curing accelerator, a boron-based curing accelerator, and an imidazole-based curing accelerator.

The filler may have a spherical shape and has an average particle size of about 500 nm to about 5 μm.

The embodiments may also be realized by providing an adhesive composition for semiconductor devices, the adhesive composition having an adhesive strength of about 10 kgf/mm$^2$ or more and exhibiting a variation in adhesive strength of less than about 1% after 30 days.

The adhesive composition may include a silane coupling agent, the silane coupling agent including an epoxy group-containing silane coupling agent and a transition metal scavenging functional group-containing silane coupling agent.

The embodiments may also be realized by providing an adhesive film for semiconductor devices, the adhesive film being prepared using the adhesive composition of an embodiment.

The adhesive film may contain less than about 2 wt % remaining solvent

The embodiments may also be realized by providing a dicing die-bonding film including the adhesive film of an embodiment.

DETAILED DESCRIPTION

Korean Patent Application No. 10-2009-0132244, filed on Dec. 28, 2009, in the Korean Intellectual Property Office, and entitled: "Adhesive Composition for Semiconductor Device and Adhesive Film Using the Same," is incorporated by reference herein in its entirety.

Example embodiments will now be described so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

Adhesive Composition

The embodiments provide an adhesive composition including an elastomer resin, an epoxy resin, a curable phenolic resin, a curing accelerator, a silane coupling agent, and a filler.

In the following description, the content of each component will be described in terms of solid content unless noted otherwise.

Elastomer Resin

The elastomer resin may be an acrylic polymer resin. The elastomer resin may be a rubber component that is used for the formation of a film. The elastomer resin may contain, e.g., hydroxyl, carboxyl, and/or epoxy groups.

The acrylic polymer resin may be prepared through copolymerization of, e.g., (C1~C20) alkyl(meth)acrylates. For example, the acrylic polymer resin may include about 50% or more of (C1~C20) alkyl(meth)acrylate, based on a total weight of the acrylic polymer resin. Examples of (C1~C20) alkyl(meth)acrylates may include, but are not limited to, methyl(meth)acrylate, ethyl(meth)acrylate, propyl(meth)acrylate, butyl(meth)acrylate, 2-ethylhexyl(meth)acrylate, isooctyl acrylate, stearyl methacrylate, and the like. These components may be used alone or in a combination of two or more thereof.

In an implementation, a glass transition temperature and a molecular weight of the acrylic polymer resin may be controlled, or a functional group may be introduced into side chains of the acrylic polymer resin, through introduction of suitable co-monomers for polymerization. Suitable co-monomers for the preparation of the acrylic polymer resin may include, e.g., acrylonitrile, acrylic acid, 2-hydroxyethyl (meth)acrylate, styrene monomer, glycidyl(meth)acrylate, and the like. The co-monomers may be used alone or in a combination of two or more thereof. The co-monomer may be present in an amount of about 50 wt % or less and preferably about 30 wt % or less, e.g., about 0.1 to about 20 wt %, based on the total weight of the acrylic polymer resin.

Acrylic polymer resins may be classified on the basis of, e.g., their epoxy equivalent weight, glass transition temperature, and molecular weight. A commercial product for the acrylic polymer resin having an epoxy equivalent weight exceeding 10,000 may include, e.g., SG-80H series products (Nagase Chemtex). Commercial products for the acrylic polymer resin having an epoxy equivalent weight of 10,000 or less may include, e.g., SG-P3 series products and SG-800H series products. In an implementation, the acrylic polymer resin may have an epoxy equivalent weight of about 5,000 g/eq or less. In another implementation, the acrylic polymer resin may have an epoxy equivalent weight of about 1,000 to about 4,000 g/eq.

In an implementation, the acrylic polymer resin may have a hydroxyl value of about 1 to about 25 mgKOH, and preferably about 5 to about 20 mgKOH. In an implementation, the acrylic polymer resin may have an acid value of about 35 to about 90 mgKOH, and preferably about 50 to about 80 mgKOH.

The acrylic polymer resin may have a glass transition temperature (Tg) of about 0 to about 40° C. Maintaining the Tg at about 0 to about 40° C. may help prevent brittleness at room temperature of a film prepared from the adhesive composition and may help prevent burring or chipping during a chip sawing process in semiconductor assembly. In an implementation, the acrylic polymer resin may have a glass transition temperature (Tg) of about 5 to about 40° C.

The acrylic polymer resin may have a weight average molecular weight (Mw) of about 100,000 to about 700,000 g/mol. In an implementation, the acrylic polymer resin may have a weight average molecular weight of about 300,000 to about 700,000 g/mol.

The acrylic polymer resin may be present in an amount of about 2 to about 50 wt % (in terms of solid content), based on a total weight of the adhesive composition. Maintaining the amount of the acrylic polymer resin at about 2 to about 50 wt % may help ensure good film formability and reliability. In an implementation, the acrylic polymer resin may be present in an amount of about 2 to about 25 wt %. In another implementation, the acrylic polymer resin may be present in an amount of about 10 to about 20 wt %.

Epoxy Resin

The epoxy resin may have sufficiently high cross-linking density to exhibit strong curing and adhesive properties. However, a single curable epoxy system with a high cross-linking density may provide a brittle film. Accordingly, the epoxy resin may be prepared by mixing a liquid-like epoxy resin or mono- or bi-functional epoxy resins (having a minimum cross-linking density) with a multi- or polyfunctional epoxy resin.

The epoxy resin having a minimum cross-linking density may have an epoxy equivalent weight of about 100 to about 1,500 g/eq, preferably about 150 to about 800 g/eq, and more preferably about 150 to about 500 g/eq. Maintaining the epoxy equivalent weight at about 100 to about 1,500 g/eq may help prevent a reduction in glass transition temperature while ensuring good adhesion and thermal resistance.

An example of a suitable epoxy resin that exhibits curing and adhesive properties may include an epoxy resin having at least one functional group that is solid or solid-like in consideration of a shape of the film.

Examples of the epoxy resin may include, but are not limited to, bisphenol-based epoxy resins, ortho-cresol novolac-based epoxy resins, multi-functional epoxy resins, amine-based epoxy resins, heterocyclic epoxy resins, substituted epoxy resins, and naphthol-based epoxy resins. Examples of commercially available bisphenol-based epoxy resins may include, but are not limited to, E4275 (JAPAN EPOXY RESIN); Epiclon 830-S, Epiclon EXA-830CRP, Epiclon EXA 850-S, Epiclon EXA-835LV, etc. (Dainippon Ink and Chemicals, Inc.); Epicoat 807, Epicoat 815, Epicoat 825, Epicoat 827, Epicoat 828, Epicoat 834, Epicoat 1001, Epicoat 1004, Epicoat 1007, and Epicoat 1009 (Yuka Shell Epoxy Co., Ltd.); DER-330, DER-301, and DER-361, (Dow Chemical Co.); and YD-011, YDF-019, YD-128, YDF-170, etc. (Kukdo Chemical Co., Ltd.). Examples of commercially available ortho-cresol novolac-based epoxy resins may include, but are not limited to, YDCN-500-1P, YDCN-500-4P, YDCN-500-5P, YDCN-500-7P, YDCN-500-80P, and YDCN-500-90P (Kukdo Chemical Co., Ltd.); and EOCN-102S, EOCN-103S, EOCN-104S, EOCN-1012, EOCN-1025, and EOCN-1027 (Nippon Kayaku Co., Ltd.). Examples of commercially available multi- or polyfunctional epoxy resins may include, but are not limited to, Epon 1031S (Yuka Shell Epoxy Co., Ltd.); Araldite 0163 (Ciba Specialty Chemicals); and Detachol EX-611, Detachol EX-614, Detachol EX-614B, Detachol EX-622, Detachol EX-512, Detachol EX-521, Detachol EX-421, Detachol EX-411, and Detachol EX-321. (NAGA Celsius Temperature Kasei Co., Ltd.). Examples of commercially available amine-based epoxy resins may include, but are not limited to, Epicoat 604 (Yuka Shell Epoxy Co., Ltd.); YH-434 (Tohto Kasei Co., Ltd.); TETRAD-X and TETRAD-C (Mitsubishi Gas Chemical Company Inc.); and ELM-120 (Sumitomo Chemical Industry Co., Ltd.). An example of a commercially available heterocyclic epoxy resins may include, but is not limited to, PT-810 (Ciba Specialty Chemicals). Examples of commercially available substituted epoxy resins may include, but are not limited to, ERL-4234, ERL-4299, ERL-4221, ERL-4206, etc. (UCC Co., Ltd.). Examples of commercially available naphthol-based epoxy resins may include, but are not limited to, Epiclon HP-4032, Epiclon HP-4032D, Epiclon HP-4700, Epiclon HP-4701 (Dainippon Ink and Chemicals, Inc.) and the like. The above epoxy resins may be used alone or in a combination of two or more thereof.

In an implementation, the epoxy resin may include about 50 wt % or more of the polyfunctional epoxy resin, based on a total weight of the epoxy resin. Maintaining the amount of the polyfunctional epoxy resin about 50 wt % or more may help ensure that the epoxy resin has an increased cross-linking density to thereby enhance internal bonding strength of the structure and to obtain good reliability. The polyfunctional epoxy resin is preferably present in an amount of about 60 to about 90 wt % and more preferably about 65 to about 85 wt %, based on the total weight of the epoxy resin.

The epoxy resin is preferably present in an amount of about 4 to about 50 wt %, and more preferably about 4 to about 35 wt %, based on the total weight of the adhesive composition. Maintaining the amount of the epoxy resin at about 4 to about 50 wt % may help ensure that a film formed from the adhesive composition has superior reliability and also maintains compatibility. In an implementation, the epoxy resin may be present in an amount of about 35 wt % or less, e.g., about 4.5 to about 25 wt %, in view of reducing surface tackiness at room temperature of the adhesive film prepared from the adhesive composition (to decrease adhesion between the adhesive film and a chip to facilitate picking up in a pickup process). In an implementation, the epoxy resin may be included in an amount of about 10 to about 30 wt %, based on the total weight of the adhesive composition.

Curable Phenolic Resin

The curable phenolic resin may be, e.g., a phenolic epoxy resin curing agent, and is not particularly limited. Any suitable curable phenolic resin may be used. Suitable curable phenolic resins may have two or more phenolic hydroxyl groups per molecule. Examples of the curable phenolic resins may include, but are not limited to, bisphenol A, bisphenol F, and bisphenol S resins, phenol novolac resins, bisphenol A novolac resins, cresol novolac resins, xylok resins, and biphenyl resins. For example, suitable curable phenolic resins may be highly resistant to electrolytic corrosion upon moisture absorption.

Examples of commercially available curable phenolic resins may include, but are not limited to, simple curable phenolic resins, such as H-1, H-4, HF-1M, HF-3M, HF-4M, and HF-45 (Meiwa Kasei Co., Ltd.); para-xylene-based resins such as MEH-78004S, MEF-7800SS, MEH-7800S, MEH-7800M, MEH-7800H, MEH-7800HH, and MEH-78003H (Meiwa Kasei Co., Ltd.), and KPH-F3065 (KOLON Chemical Co., Ltd.); biphenyl-based resins such as MEH-7851SS, MEH-7851S, MEH-7851M, MEH-7851H, MEH-78513H, and MEH-78514H (Meiwa Kasei Co., Ltd.), and KPH-F4500 (KOLON Chemical Co., Ltd.); and triphenylmethyl-based resins such as MEH-7500, MEH-75003S, MEH-7500SS, MEH-7500S, MEH-7500H (Meiwa Kasei Co., Ltd.) and the like. The above curable phenolic resins may be used alone or in a combination of two or more thereof.

In an implementation, the curable phenolic resin may have a hydroxyl equivalent weight of about 100 to about 600 g/eq. and preferably about 100 to about 300 g/eq. Maintaining the hydroxyl equivalent weight at about 100 to about 600 g/eq may help ensure that proper moisture absorption and reflow resistance are maintained and the glass transition temperature does not decrease, thereby providing good thermal resistance.

The curable phenolic resin may include about 50 wt % or more of a phenol novolac resin, based on a total weight of the curable phenolic resin. Maintaining the amount of the phenol novolac resin at about 50 wt % or more may help ensure that cross-linking density increases after curing (so that intermolecular cohesion and internal bonding strength are increased), thereby improving adhesion of the composition. Moreover, the composition may exhibit low deformation by external stress, which may be advantageous in maintaining a constant thickness of a film prepared from the adhesive composition. In an implementation, the curable phenolic resin may include about 75 to about 100 wt % of the phenol novolac resin, based on the total weight of the curable phenolic resin.

The curable phenolic resin is preferably included in the adhesive composition in an amount of about 3 to about 50 wt % and more preferably about 3 to about 30 wt %, based on the total weight of the adhesive composition. In an implementation, the amount of curable phenolic resin may be about 10 to about 35 wt %, based on the total weight of the adhesive composition.

Curing Accelerator

The curing accelerator may be added to control a curing rate of the adhesive composition. Suitable curing accelerators may include, e.g., phosphine-, boron-, and imidazole-based curing accelerators.

Examples of the phosphine-based curing accelerators may include, but are not limited to, triphenylphosphine, tri-o-tolylphosphine, tri-m-tolylphosphine, tri-p-tolylphosphine, tri-2,4-xylylphosphine, tri-2,5-xylylphosphine, tri-3,5-xylylphosphine, tribenzylphosphine, tris(p-methoxyphenyl)phosphine, tris(p-tert-butoxyphenyl)phosphine, diphenylcyclohexylphosphine, tricyclohexylphosphine, tributylphosphine, tri-tert-butylphosphine, tri-n-octylphosphine, diphenylphosphinostyrene, diphenylphosphinouschloride, tri-n-octylphosphine oxide, diphenylphosphinyl hydroquinone, tetrabutylphosphonium hydroxide, tetrabutylphosphonium acetate, benzyltriphenylphosphonium hexafluoroantimonate, tetraphenylphosphonium tetraphenylborate, tetraphenylphosphonium tetra-p-tolylborate, benzyltriphenylphosphonium tetraphenylborate, tetraphenylphosphonium tetrafluoroborate, p-tolyltriphenylphosphonium tetra-p-tolylborate, triphenylphosphine triphenylborane, 1,2-bis(diphenylphosphino)ethane, 1,3-bis(diphenylphosphino)propane, 1,4-bis(diphenylphosphino)butane, bis(diphenylphosphino)pentane, and the like.

Examples of the boron-based curing accelerators may include, but are not limited to, phenyl boronic acid, 4-methylphenyl boronic acid, 4-methoxyphenyl boronic acid, 4-trifluoromethoxyphenyl boronic acid, 4-tert-butoxyphenyl boronic acid, 3-fluoro-4-methoxyphenyl boronic acid, pyridine-triphenylborane, 2-ethyl-4-methylimidazolium tetraphenylborate, 1,8-diazobicyclo[5.4.0]undecene-7-tetraphenylborate, etc.

Examples of the imidazole-based curing accelerators may include, but are not limited to, 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium-trimellitate, 1-cyanoethyl-2-phenylimidazolium-trimellitate, 2,4-diamino-6-[2'-methylimidazoly-(1')]-ethyl-s-triazine, 2,4-diamino-6-[2'-undecylimidazoly-(1')]-ethyl-s-triazine, 2,4-diamino-6-[2'-ethyl-4'methylimidazoly-(1')]-ethyl-triazine, 2,4-diamino-6-[2'-methylimidazoly-(1')]-ethyl-s-triazine isocyanuric acid adduct dihydrate, 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihydro-1H-pyrrolo[1,2-a]benzimidazole, 4,4'-methylene bis(2-ethyl-5-methylimidazole), 2-methylimidazoline, 2-phenylimidazoline, 2,4-diamino-6-vinyl-1,3,5-triazine, 2,4-diamino-6-vinyl-1,3,5-triazine isocyanuric acid adduct, 2,4-diamino-6-methacryloyloxylethyl-1,3,5-triazine isocyanuric acid adduct, 1-(2-cyanoethyl)-2-ethyl-4-methylimidazole, 1-cyanoethyl-2-methylimidazole, 1-(2-cyanoethyl)-2-phenyl-4,5-di-(cyanoethoxymethyl)imidazole, 1-acetyl-2-phenylhydrazine, 2-ethyl-4-methyl imidazoline, 2-benzyl-4-methyl imidazoline, 2-ethyl imidazoline, 2-phenyl imidazole, 2-phenyl-4,5-dihydroxymethylimidazole, etc.

The above curing accelerators may be used alone or in a combination of two or more thereof.

The curing accelerator may be included in the adhesive composition in an amount of about 0.01 to about 10 wt %, based on the total weight of the adhesive composition. Maintaining the amount of the curing accelerator within this range may help ensure that the adhesive composition demonstrates excellent storage stability. In an implementation, the amount of curing accelerator in the adhesive composition may be about 0.01 to about 2 wt %, based on the total weight of the adhesive composition.

Silane Coupling Agent and Transition Metal Scavenger

The silane coupling agent may include both an epoxy group-containing silane coupling agent and a transition metal scavenging functional group-containing silane coupling agent.

The transition metal scavenging functional group may significantly reduce mobility of transition metals by binding to transition metal ions or by oxidizing or reducing the transition metal ions. According to an embodiment, the functional group (capable of oxidizing or reducing transition metals or reducing the mobility of the transition metals), may be introduced into the silane coupling agent to control the transition metals. Also, overall functions of an adhesive film prepared from the adhesive composition may be maintained, thereby preventing deterioration in reliability of semiconductor chips (due to infiltration of transition metals or transition metal ions, which may be impurities remaining on a surface of the semiconductor chip, into an interface between the adhesive film and the surface of the semiconductor chip).

Examples of the epoxy group-containing silane coupling agent may include, but are not limited to, 2-(3,4-epoxycyclohexyl)-ethyltrimethoxysilane, 3-glycidoxytrimethoxysilane, 3-glycidoxypropyltrimethoxysilane, 3-glycidoxypropyltriethoxysilane and the like. The above components may be used alone or in a combination of two or more thereof.

In an implementation, the epoxy group-containing silane coupling agent may be present in an amount of about 15 wt % to less than about 100 wt %, based on a total weight of the silane coupling agent. In another implementation, the epoxy group-containing silane coupling agent may be present in an amount of about 20 to about 50 wt %, based on the total weight of the silane coupling agent. For example, the epoxy group-containing silane coupling agent may be present in an amount of about 25 to about 60 wt %, based on the total weight of the silane coupling agent.

In an implementation, the silane coupling agent may include about 30 to about 60 wt % of the epoxy group-containing silane coupling agent and about 40 to about 70 wt % of the transition metal scavenging functional group-containing silane coupling agent, based on the total weight of the silane coupling agent.

The transition metal scavenging functional group may include at least one of —CN, —COOH, —NCO, —SH and —NH$_2$. For example, at least one of a cyanide group-containing silane coupling agent, a silane, an acid-containing, e.g., carboxylic acid-containing, silane coupling agent, an isocyanate-containing silane coupling agent, a mercapto group-containing silane coupling agent, and an amine group-containing silane coupling agent may be used as the transition metal scavenging functional group-containing silane coupling agent.

Examples of the mercapto group (—SH)-containing silane coupling agent may include, but are not limited to, 3-mercaptopropylmethyldimethoxysilane, 3-mercaptopropyltriethoxysilane, and 3-mercaptopropyltrimethoxysilane.

An example of the isocyanate containing silane coupling agent may include, but is not limited to, 3-isocyanate propyltriethoxysilane.

Examples of the amine group-containing silane coupling agent may include, but are not limited to, N-2(aminoethyl)-3-aminopropyl methyldimethoxysilane, N-2(aminoethyl)-3-aminopropyl trimethoxysilane, N-2(aminoethyl)-3-aminopropyl triethoxysilane, 3-aminopropyltrimethoxysilane, 3-aminopropyltriethoxysilane, 3-triethoxysilyl-N-(1,3-dimethylbutylidene)propylamine, and N-phenyl-3-aminopropyltrimethoxysilane.

The transition metal scavenging functional group-containing silane coupling agents may be used alone or in a combination of two or more thereof. For example, a combination of the mercapto group-containing silane coupling agent and the amine group-containing silane coupling agent, and/or a combination of the mercapto group-containing silane coupling agent and the isocyanate group-containing silane coupling agent, may be advantageously used.

In an implementation, the silane coupling agent may be present in an amount of about 0.1 to about 10 wt %, based on the total weight of the adhesive composition. In another implementation, the silane coupling amount may be present in an amount of about 1 to about 7 wt %.

In addition, the adhesive composition may further include a transition metal scavenger that contains the transition metal scavenging functional group, e.g., —CN, —COOH, —NCO, —SH, or —NH$_2$, capable of controlling transition metals.

The transition metal scavenger having the transition metal scavenging functional group may include, e.g., cyanides having a nitrile group, acrylonitrile, 2-amino-1,1,3-tricyano-1-propane, 4,4-azobis(4-cyanovaleric acid), 1,1-azobis(2,4-dimethylvaleronitrile), 2,2-azobis(2-methylbutyronitrile), tetracyanoethylene, azelanitrile, malononitrile dimer, and triazole derivatives (available from Ciba Irgamet Co., Ltd.). Examples of inorganic compounds having an ion scavenging function (e.g., a transition metal ion scavenging function) may include, but are not limited to, a hydrotalcite-based ion scavenger, a bismuth oxide-based ion scavenger, an antimony oxide-based ion scavenger, a titanium oxide-based ion scavenger, and a zirconium phosphide-based ion scavenger (according to scavenging targets, e.g., phosphoric acid, phosphorous acid, organic acid anions, halogen anions, alkali metal cations, and alkali metal cations), for elimination of ionic impurities. The above compounds may be used alone or in a combination of two or more thereof. In an implementation, cyanides may be used as the transition metal scavenger.

As described above, the transition metal scavenger containing the transition metal scavenging functional group may be included in the adhesive composition. In an implementation, if the scavenger containing the transition metal scavenging functional group is not included, the transition metal scavenging functional group-containing silane coupling agent alone may act as the transition metal scavenging component.

In another implementation, the transition metal scavenger having the transition metal scavenging functional group may be added to the adhesive composition for semiconductor devices. Thus, both the transition metal scavenging functional group-containing silane coupling agent and the scavenger having the transition metal scavenging functional group may act as transition metal scavenging components.

An amount of the transition metal scavenging components (in the adhesive composition) may be higher than that of the epoxy group-containing silane coupling agent (in the adhesive composition). For example, an amount of the transition metal scavenger having the transition metal scavenging functional group plus the transition metal scavenging functional group-containing silane coupling agent may be greater than an amount of the epoxy group-containing silane coupling agent.

In an implementation, a total weight of the transition metal scavenging functional group-containing silane coupling agent and the transition metal scavenger may be about 50 wt % to less than about 100 wt %, relative to an overall weight of the silane coupling agent and the transition metal scavenger. Including the transition metal scavenging functional group-containing silane coupling agent and the transition metal scavenger in these amounts may further improve the transition metal scavenging function. For example, maintaining the total weight of the scavenging functional group-containing silane coupling agent and the transition metal scavenger at about 50 wt % or greater may help ensure that reactivity with transition metals is not lowered. The total weight of the scavenging functional group-containing silane coupling agent and the transition metal scavenger is preferably about 50.5 to about 85 wt % and more preferably about 55 to about 75 wt %, relative to the overall weight of the silane coupling agent and the transition metal scavenger.

Filler

The filler may be selectively added to the adhesive composition to provide thixotropic properties and to control melt viscosity.

The filler may include inorganic or organic fillers as desired. Examples of the inorganic fillers may include, but are not limited to, metallic components, such as gold, silver, copper and nickel powder; and nonmetallic components, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, ferrite, ceramic, etc. Examples of the organic fillers may include, but are not limited to, carbon, rubber fillers, polymer-based fillers, etc.

There is no particular restriction as to the shape and size of the filler. In an implementation, spherical silica may be used as the filler. In another implementation, the filler may be spherical filler with a hydrophobic surface, as desired.

The spherical silica may have a particle size of about 500 nm to about 10 μm. Maintaining the particle size within this range may help ensure that the filler does not damage a semiconductor circuit. In an implementation, the filler may have a particle size of about 500 nm to about 5 μm.

The filler may be included in an amount of about 0.1 to about 50 wt %, based on the total weight of the adhesive composition. Maintaining the amount of the filler within this range may help ensure that a film formed from the adhesive composition is easily formed and has good tensile strength. In the case that an adhesive film according to an embodiment is applied to die adhesive films having the same size, the amount of filler may be about 10 to about 40 wt %.

Organic Solvent

The adhesive composition may further include an organic solvent. The organic solvent may reduce the viscosity of the adhesive composition, thereby facilitating fabrication of the adhesive film. However, organic solvents remaining in the adhesive film may affect physical properties of the adhesive film. Thus, an amount of remaining organic solvents may be kept at about 2 wt % or less.

Examples of the organic solvents may include, but are not limited to, benzene, acetone, methylethylketone, tetrahydrofuran, dimethylformamide, cyclohexane, propylene glycol monomethylether acetate, and cyclohexanone. The solvents may be used alone or in a combination of two or more thereof. For example, the organic solvent may include a mixture of a high boiling point solvent and a low boiling point solvent. For example, the high boiling point solvent may have a boiling point of about 100 to about 150° C. The low boiling point solvent may have a boiling point of about 50 to about 100° C. For example, a ratio of low boiling point solvent and high boiling point solvent may be about 30 to about 100 wt %:about 0 to about 70 wt %. Within this ratio, the amount of remaining organic solvents may be adjusted at about 2 wt % or less.

The organic solvent may induce formation of a uniform mixture to relieve void occurrence when forming the adhesive film. Moreover, after the formation of the adhesive film, a small amount of organic solvents may remain in the film to soften the film, thereby preventing the film from being undesirably cut.

The adhesive composition may have an adhesive strength of about 10 kgf/mm² or more. The adhesive composition may exhibit a variation in adhesive strength of less than about 1% after 30 days. For example, the adhesive composition may have an adhesive strength of about 11 to about 25 kgf/mm² or more and may exhibit a variation in adhesive strength of less than about 0.5% after 30 days Adhesive Film Another embodiment provides an adhesive film formed from the adhesive composition for semiconductor devices. The adhesive film may contain less than about 2 wt % remaining solvent.

The adhesive film may be dried at a temperature of about 80 to about 120° C. for about 10 to about 60 minutes.

By controlling the dying temperature or time, the low boiling point solvent remaining in the composition may be removed; and an amount of the high boiling point solvent may be adjusted to be less than about 2 wt %.

The adhesive film may be subjected to curing at about 120 to about 150° C. for about 1 to about 10 minutes.

For example, the adhesive film may be subjected (about 1 to 8 times) to a cyclic curing process, which may include primary curing at about 120 to about 130° C. for about 1 to about 3 hours and secondary curing at about 130 to about 150° C. for about 10 to about 60 minutes. Through this process, a degree of volatility of the remaining solvent may be adjusted.

Thus, it may be possible to regulate effects resulting from volatility of the solvent during the curing process in consideration of various physical properties and the kind and content of remaining solvent in the composition.

In the curing process, only a concentration of high boiling point solvent in the film may be decreased to eliminate the occurrence of voids due to volatile ingredients and to relieve expansion of bubbles in die attachment.

For example, if a solvent with a boiling point less than a curing temperature (about 125° C.) is used, voids may be formed due to remaining solvent during the curing process. Further, if a solvent with a boiling point of more than about 200° C. is used, the amount of remaining solvent may be about 2 wt % or more during the formation of the film, thereby causing volume expansion and deteriorating reliability during an EMC molding process or reliability test.

In an implementation, a suitable ratio and amount of low boiling point solvent and high boiling point solvent may be included in the adhesive composition according to an embodiment. For example, by maintaining a suitable ratio, volume expansion of gaps or voids formed at an interface may be reduced (to thereby eliminate the occurrence of voids when bonding a chip to the interface). In addition, volume expansion caused by gaps or voids in wire filling may be reduced, thereby providing an adhesive film for semiconductor devices with high reliability. Moreover, brittleness of the film before curing may be reduced to thereby prevent contamination of the film (due to fragments of the adhesive film in the sawing or mounting process) and to facilitate handling of the film.

As described above, in the adhesive film according to an embodiment, the amount of remaining solvent may be less than about 2 wt %. Thus, a solid content in the adhesive film formed from the composition may be about 98 wt % or more. Maintaining the solid content in the adhesive film at about 98 wt % or more may help prevent bubbles or moisture absorption, thereby ensuring reliability.

The adhesive film may exhibit an elongation of about 150 to about 400%. The adhesive film may have a storage elastic modulus of about 0.1 to about 10 MPa at 25° C. and a storage elastic modulus of about 0.01 to about 0.10 MPa at 80° C. The adhesive film may have a melt viscosity of about 1,000,000 to about 5,000,000 P at 25° C. and a surface tackiness of less than about 0.1 Kgf. For example, the adhesive film may not undergo variation in viscosity or surface tackiness due to the presence of the solvent in the film. Thus, desirable properties for a semiconductor assembly process may not be substantially affected. For example, storage elastic modulus, liquidity, and surface tackiness of the adhesive composition before curing may be maintained regardless of the presence of the high boiling point solvent. Thus, the adhesive film may not be affected (by the high boiling point solvent) in view of storage at room temperature.

The adhesive film according to an embodiment may exhibit plasticity due to a low volatilizing rate and a small volatilizing amount at a temperature of from about 125° C. to less than about 175° C. (as compared with a film formed of a solvent with a low boiling point). Thus, breakage of the film may be prevented. Moreover, the occurrence of voids may also be suppressed to such a degree that generation of voids on the substrate may be less than about 5% in the semiconductor assembly process. Accordingly, a decrease in reliability may be prevented.

Dicing Die-Bonding Film

Another embodiment provides a dicing die-bonding film that includes the adhesive film for semiconductor devices according to an embodiment. According to the present embodiment, the dicing die-bonding film may include an adhesive layer and an adhesive film layer sequentially stacked on a base film. For example, the adhesive film layer may be formed from the adhesive film according to an embodiment.

The adhesive layer may be formed of any suitable adhesive composition. For example, the adhesive composition for the adhesive layer may include about 100 parts by weight of an elastomer resin, about 20 to about 150 parts by weight of a UV-curable acrylate, and about 0.1 to about 5 parts by weight of a photo initiator, based on 100 parts by weight of the UV-curable acrylate.

The base film may be a radiolucent material. If a radiation curable adhesive activated by ultraviolet light is used, the base film may be formed of a material including polymers exhibiting favorable light transmittance. Examples of the polymers may include, but are not limited to, polyolefin homopolymers or copolymers, such as polyethylene, polypropylene, a propylene ethylene copolymer, an ethylene ethyl acrylic acid copolymer, an ethylene acrylic acid methyl copolymer, an ethylene vinyl acetate copolymer, etc., polycarbonate, polymethyl methacrylate, polyvinyl chloride, a polyurethane copolymer, etc. The base film may have a thickness of about 50 to about 200 μm in consideration of tensile strength, elongation, radiolucent properties, etc.

The following Examples and experiments are given for illustrative purposes only and are not intended to limit the scope of this disclosure. Moreover, the Comparative Examples are set forth to highlight certain characteristics of certain embodiments and are not to be construed as either limiting the scope of the invention as exemplified in the Examples or as necessarily always being outside the scope of the invention in every respect

EXAMPLES

Testing Reactivity of Coupling Agent and Scavenger Against a Transition Metal Solution To confirm reactivity of the coupling agents of the embodiments with respect to transition metals, the coupling agent was mixed with a transition metal solution containing $Cu^{2+}$ ions. For example, after dissolving transition metals, the transition metal solution was dropped into a flask with each of the coupling agents therein, followed by measurement of the reactivity of the coupling agent. Results are summarized using O or X in Table 1, below. For example, O represents a case in which the coupling agent reacted with the $Cu^{2+}$ ions and X represents a case in which the coupling agent did not react with the $Cu^{2+}$ ions.

TABLE 1

|  |  | KBM-303 | S-810 | KBM-602 | malononitrile dimer | tetracyano ethylene | azelanitrile |
|---|---|---|---|---|---|---|---|
| Ion reactivity | 25° C. | x | o | o | x | x | x |
|  | 70° C. | x | o | o | o | o | o |

KBM-303: beta-(3,4-Epoxycyclohexyl)ethyltrimethoxysilane
S-810: 3-Mercaptopropyltrimethoxysilane
KBM-602: N-2(aminoethyl)3-aminopropylmethyldimethoxysilane Examples 1 to 4 and Comparative Examples 1 to 5

The components listed in Tables 2 and 3, below, were added to a 1 L beaker and dispersed at a speed of 4000 rpm for 20 minutes with a high speed impeller to prepare compositions. Each of the compositions was processed twice through a bead mill for 30 minutes. Then, the composition was filtered through a 50 μm capsule filter and then deposited to a thickness of 60 μm on a polyethylene terephthalate (PET) film (the surface of which was subjected to release coating) using an applicator. Then, drying was performed at 90~120° C. for 20 minutes to prepare an adhesive layer. The components used in the examples and comparative examples are as follows.

(1) Elastomer Resin: KLS-1045 (hydroxyl value: 13 mgKOH/g, acid value: 63 mgKOH/g, Tg 38° C., weight average molecular weight: 690,000, Fujikura Ltd.)

(2) Bisphenol-based Epoxy Resin: YD-011 (equivalent weight: 450 (g/eq), weight average molecular weight: 10,000 or less, Kukdo Chemical Co., Ltd.)

(3) Polyfunctional Epoxy Resin (EP-5100R, Kukdo Chemical Co., Ltd.)

(4) Curable Phenolic Resin: phenol novolac resin (DL-92, hydroxyl equivalent weight: 105 (g/eq), weight average molecular weight: 1,000 or less, Meiwa Plastic Industries, Ltd.)

(5) Curing Accelerator: phosphine-based curing accelerator (TPP-K, TPP, or TPP-MK, Meiwa Plastic Industries, Ltd.)

(6) Epoxy silane coupling agent (KBM-303, equivalent weight: 246 (g/eq), Shin-Etsu Chemical Co., Ltd.)

(7) Mercapto silane coupling agent (S-810, equivalent weight: 196 (g/eq), Chisso Corporation)

(8) Amino silane coupling agent (KBM-602, equivalent weight: 206 (g/eq), Shin-Etsu Chemical Co., Ltd.)

(9) Scavenger (Tetracyano ethylene, equivalent weight: 32 (g/eq), Tokyo Kayaku Co., Ltd.)

(10) Filler: spherical silica (SC-4500SQ, SC-2500SQ, Admatechs Co., Ltd.)

using a microscope was observed. Corrosion of the samples due to failure of electrical conduction was tested under extreme test conditions. Samples that did not exhibit electrical conduction failure are indicated by O and samples that exhibited electrical conduction failure are indicated by X, as shown in Table 4, below.

Performance of Devices

Semiconductor chips were assembled using the prepared adhesive film and subjected to a device performance test. Whether the device was properly operated was checked; and the performance of each device was determined as pass/fail. The results are shown in Table 4, below.

Adhesive Strength

A 725 μm thick wafer coated with a dioxide film was cut into chips (5×5 mm). The chips were laminated with each of the prepared adhesive films at 60° C. The laminate was cut to leave behind an attached portion only. A wafer piece laminated with the adhesive was compressed onto a 725 μm thick wafer (10×10 mm) coated with photosensitive polyimide on a hot plate at 100° C. by a force of 1.0 kgf for 1 second and was cured in stages (first at 125° C. for 1 hour and then at 175° C. for 3 hours). The sample was allowed to absorb moisture at 85° C. and 85 RH % for 48 hours; and fracture strength of the sample was measured at 270° C. The results are shown in Table 4, below.

TABLE 2

|  | Solid content (%) | Example 1 | Example 2 | Example 3 | Example 4 |
|---|---|---|---|---|---|
| Elastomer resin | 20 | 180 | 180 | 180 | 180 |
| Epoxy Resin  Bisphenol-based | 30 | 20 | 20 | 20 | 20 |
| Epoxy Resin  Polyfunctional | 60 | 80 | 80 | 80 | 80 |
| Curable phenolic resin | 100 | 60 | 60 | 60 | 60 |
| Curing accelerator | 60 | 4 | 4 | 4 | 4 |
| Epoxy silane coupling agent | 100 | 5 | 6.8 | 5 | 6.8 |
| Mercapto silane coupling agent | 100 | 6.4 | 7.2 | — | 4.6 |
| Amino silane coupling agent | 100 | 1.6 | — | 12 | — |
| Scavenger | 100 | — | — | — | 2.4 |
| Filler | 100 | 70 | 70 | 70 | 70 |

TABLE 3

|  | Solid content (%)* | Comparative Example 1 | Comparative Example 2 | Comparative Example 3 | Comparative Example 4 | Comparative Example 5 |
|---|---|---|---|---|---|---|
| Elastomer resin | 20 | 180 | 180 | 180 | 180 | 180 |
| Epoxy Resin  Bisphenol-based | 30 | 20 | 20 | 20 | 20 | 20 |
| Epoxy Resin  Polyfunctional | 60 | 80 | 80 | 80 | 80 | 80 |
| Curable phenolic resin | 100 | 60 | 60 | 60 | 60 | 60 |
| Curing accelerator | 60 | 4 | 4 | 4 | 4 | 4 |
| Epoxy silane coupling agent | 100 | — | 1.5 | 8 | 6.8 | — |
| Mercapto silane coupling agent | 100 | — | 10 | — | — | 4 |
| Amino silane coupling agent | 100 | — | — | 1.6 | — | 2.4 |
| Scavenger | 100 | — | — | — | 0.8 | 6 |
| Filler | 100 | 70 | 70 | 70 | 70 | 70 |

Electrical Reliability

The prepared adhesive film was attached to a comb-shaped electrode (conductor/line-width=100 μm/100 μm) and left at 125° C. for 1 hour, followed by heating at 170° C. for 2 hours and compression to prepare samples for the electrical reliability test. Each of the prepared samples was tested by applying a voltage of 50 V thereto for 100 hours under conditions of 130° C. and 85% RH. Then, a gap between the electrodes Moisture Absorption Rate To measure moisture absorption rate of the adhesive films, each of the films were laminated into 14 folds at 60° C. and cut into a sample having a size of 40×40 mm and a total weight of about 2 g. The sample was cured in stages (first at 125° C. for 1 hour and then at 175° C. for 3 hours) and variation in weight of the sample was recorded. Further, the sample was allowed to absorb moisture at 85° C. and 85 RH % for 8 hours; and variation in weight of the sample was recorded. Then, a ratio of the variation in weight by curing to the variation in weight by absorption of moisture was calculated in terms of percent. Results are listed in Table 4, below.

Storage Stability

After leaving each sample at room temperature for 30 hours, melt viscosity at 100° C. and adhesive strength of the sample were measured and compared with initial measurements to obtain variation in adhesive strength. Results are shown in Table 4, below.

TABLE 4

|  | Example 1 | | | | Comparative Example | | | | |
| --- | --- | --- | --- | --- | --- | --- | --- | --- | --- |
|  | 1 | 2 | 3 | 4 | 1 | 2 | 3 | 4 | 5 |
| Electrical Reliability (o/x) | o | o | o | o | x | o | x | x | o |
| Performance of Device | pass | pass | pass | pass | fail | pass | fail | fail | pass |
| Adhesive strength (kgf/mm$^2$) | 16.4 | 14.3 | 11.7 | 15.8 | 5.6 | 5.3 | 14.2 | 11.8 | 2.9 |
| Moisture Absorption rate (%) | 0.9 | 0.9 | 0.8 | 0.8 | 0.8 | 0.9 | 0.7 | 0.9 | 0.9 |
| Storage Stability (Variation in adhesive strength, %) | 0.0 | 0.7 | −0.1 | 0.1 | 0.4 | −0.1 | −1.6 | −0.7 | −0.4 |

As may be seen from the results in Table 4, the adhesive films including a transition metal scavenger and a coupling agent, (which included a particular functional group capable of reacting with transition metal ions while maintaining a film forming part or a curing part), exhibited advantageous effects in terms of electrical reliability and device performance due to reactions with the transition metal ions.

The effects were confirmed from the reactivity of the scavengers and the coupling agents with transition metals (wherein each of the coupling agents had a particular functional group), as in the examples shown in Table 1. However, in Comparative Examples 2 and 5 (which included excessive amounts of coupling agents and scavengers that exhibit high reactivity with transition metals), the adhesive compositions did not improve adhesive properties.

For example, as can be seen from Tables 3 and 4, if a relative weight of the raw materials used for scavenging transition metal ions was less than 50% of the total weight of the coupling agent and the transition metal scavenger in use of the respective coupling agents and transition metal scavengers, reactivity with transition metals was deteriorated.

It may be seen that operational efficiency of chips after semiconductor assembly was improved when all of such electrical reliability, device performance, and adhesive properties were satisfied (but not when only one of the electrical reliability, device performance, and adhesive properties was satisfied).

As may be seen from Table 4, all of Examples 1 to 4 exhibited a moisture absorption rate of less than 1% and did not suffer failure in performance of devices, (which resulted from deterioration in reliability by chip cracking related to moisture absorption or from deterioration in electrical reliability by an increase in mobility of transition metal ions). Therefore, it may be seen that Examples 1 to 4 exhibited fundamental properties capable of ensuring high reliability in semiconductor assembly by providing high adhesive strength and thermal stability (based on moisture resistance after EMC molding in the course of semiconductor assembly).

On the other hand, as in Comparative Examples 1 to 5, a deficiency of additives including a particular functional group capable of influencing adhesive strength resulted in deterioration of adhesive strength and storage stability.

For example, as can be seen from Table 4, the use of the coupling agent having a particular functional group in an adhesive composition provided high adhesive strength and good reflow resistance while ensuring high electrical reliability and device performance.

By way of summation and review, an adhesive film for semiconductor assembly may be used in conjunction with a dicing film. The dicing film may fix a semiconductor wafer during a dicing process. The dicing process may include a process of sawing a semiconductor wafer into individual chips and may be followed by subsequent processes, e.g., expanding, picking-up, and mounting. The dicing film may be formed by applying a UV-curable adhesive (or an adhesive curable in some other manner) to a base film, e.g., a film having a vinyl chloride or polyolefin-based structure. Then, a PET based cover film may be laminated thereon.

An adhesive film for semiconductor devices may be attached to a semiconductor wafer. The dicing film having the configuration described above may be stacked on a dicing film having a cover film removed therefrom, followed by sawing according to a dicing process.

Semiconductor adhesives for dicing die bonding may be prepared by a simple process. In this process, a dicing film having a PET cover film removed therefrom and an adhesive film may be combined into a single film. Then, a semiconductor wafer may be attached to the single film, followed by sawing according to the dicing process. Such a process may require simultaneous separation of the die and the die adhesive film in a pick-up process. Moreover, when the die attach film is attached to a rear side of the semiconductor wafer, gaps or voids may be created between the rough surface of the die attach film and a circuit pattern on the wafer. When exposed to a high temperature environment, the gaps or voids remaining in an interface between chips on the wafer and the die attach film may expand, leading to cracks and causing devices to fail during reliability testing. Accordingly, it may be desirable to suppress the formation of voids at the interface during all semiconductor assembly processes.

Increasing an amount of a curable component in the adhesive film may be one approach to suppressing the formation of voids. However, such an approach may result in a decrease in tensile strength of the film, thereby causing breakage of the film in a process of cutting the film (to the size of the semiconductor wafer) or burring or chipping (in the wafer sawing process). In addition, low storage modulus of the film may provide a high adhesive strength with respect to an adhesive agent (so that the film may be more likely to deform), thereby lowering a pick-up success rate. For example, for a semiconductor device employing two semiconductor chips having the same size, a semiconductor chip having a separate adhesive film may be mounted on a lower semiconductor chip having irregularities caused by the presence of wires. In this case, it may be desirable for the adhesive film to ensure insulation with respect to the semiconductor chip thereon while suppressing the formation of gaps or voids by covering the irregularities due to the presence of the wires.

A suitable adhesive film may include an adhesive composition that is primarily composed of an epoxy resin. However, a relatively high absorption rate of the epoxy resin may result in infiltration of various ionic impurities into a bonding interface between the adhesive film and a semiconductor chip during a semiconductor chip stacking process.

Among the ionic impurities, transition metal ions may have high thermal and electrical conductivity, thereby causing damage to the semiconductor chip or causing a circuit to malfunction. Therefore, it may be desirable to add a transition metal scavenger. Accordingly, the embodiments provide a method of eliminating the transition metals without deteriorating properties of the adhesive film.

Thus, the embodiments provide an adhesive composition that includes both an epoxy group-containing silane coupling agent and a transition metal scavenging functional group-containing silane coupling agent. The adhesive composition may prepare a film capable of preventing deterioration in reliability of semiconductor chips by preventing movement of transition metals and transition metal ions.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An adhesive composition for semiconductor devices, the adhesive composition comprising:
   an elastomer resin,
   an epoxy resin,
   a curable phenolic resin,
   a curing accelerator,
   a silane coupling agent, and
   a filler,
   wherein the silane coupling agent includes an epoxy group-containing silane coupling agent and a transition metal scavenging functional group-containing silane coupling agent.

2. The adhesive composition as claimed in claim 1, wherein the transition metal scavenging functional group includes at least one of —CN, —COOH, —NCO, —SH, and —NH$_2$.

3. The adhesive composition as claimed in claim 1, wherein the epoxy group-containing silane coupling agent is present in an amount of about 15 wt % to less than 100 wt %, based on a total weight of the silane coupling agent.

4. The adhesive composition as claimed in claim 3, wherein the silane coupling agent includes about 30 to about 60 wt % of the epoxy group-containing silane coupling agent and about 40 to about 70 wt % of the transition metal scavenging functional group-containing silane coupling agent.

5. The adhesive composition as claimed in claim 3, wherein:
   the adhesive composition includes a transition metal scavenging component, the transition metal scavenging component including the transition metal scavenging functional group-containing silane coupling agent, and
   the adhesive composition includes a greater amount of the transition metal scavenging component than an amount of the epoxy group-containing silane coupling agent.

6. The adhesive composition as claimed in claim 1, wherein the adhesive composition includes about 2 to about 50 wt % of the elastomer resin, about 4 to about 50 wt % of the epoxy resin, about 3 to about 50 wt % of the curable phenolic resin, about 0.01 to about 10 wt % of the curing accelerator, about 0.1 to about 10 wt % of the silane coupling agent, and about 0.1 to about 50 wt % of the filler.

7. The adhesive composition as claimed in claim 1, further comprising a transition metal scavenger.

8. The adhesive composition as claimed in claim 7, wherein the transition metal scavenger includes at least one of:
   an organic compound including at least one of cyanides and triazole derivatives; and
   an inorganic ion exchanger including at least one of a hydrotalcite-based ion scavenger, a bismuth oxide-based ion scavenger, an antimony oxide-based ion scavenger, a titanium oxide-based ion scavenger, and a zirconium phosphide-based ion scavenger.

9. The adhesive composition as claimed in claim 7, wherein the transition metal scavenger and the transition metal scavenging functional group-containing silane coupling agent are present in an amount of about 50 wt % to less than about 100 wt %, based on a total weight of the silane coupling agent and the transition metal scavenger.

10. The adhesive composition as claimed in claim 1, further comprising an organic solvent.

11. The adhesive composition as claimed in claim 1, wherein the elastomer resin includes an acrylic polymer including at least one of a hydroxyl group, a carboxyl group, and an epoxy group.

12. The adhesive composition as claimed in claim 1, wherein the epoxy resin includes about 50 wt % or more of a polyfunctional epoxy resin.

13. The adhesive composition as claimed in claim 1, wherein the curable phenolic resin includes about 50 wt % or more of a phenol novolac.

14. The adhesive composition as claimed in claim 1, wherein the curing accelerator includes at least one of a phosphine-based curing accelerator, a boron-based curing accelerator, and an imidazole-based curing accelerator.

15. The adhesive composition as claimed in claim 1, wherein the filler has a spherical shape and has an average particle size of about 500 nm to about 5 μm.

16. An adhesive film for semiconductor devices, the adhesive film being prepared using the adhesive composition as claimed in claim 1.

17. The adhesive film as claimed in claim 16, wherein the adhesive film contains less than about 2 wt % remaining solvent.

18. A dicing die-bonding film comprising the adhesive film as claimed in claim 16.

19. The adhesive composition as claimed in claim 1, wherein the adhesive composition has an adhesive strength of about 10 kgf/mm$^2$ or more and exhibits a variation in adhesive strength of less than about 1% after 30 days.

* * * * *